United States Patent [19]

Little et al.

[11] Patent Number: 4,618,946
[45] Date of Patent: Oct. 21, 1986

[54] DUAL PAGE MEMORY SYSTEM HAVING STORAGE ELEMENTS WHICH ARE SELECTIVELY SWAPPED BETWEEN THE PAGES

[75] Inventors: Wendell Little; Tim Williams, both of Austin, Tex.

[73] Assignee: Motorola, Inc., Schaumburg, Ill.

[21] Appl. No.: 651,028

[22] Filed: Sep. 17, 1984

[51] Int. Cl.⁴ ............................................. G11C 13/00
[52] U.S. Cl. .................................... 365/189; 365/230; 365/238
[58] Field of Search ........................ 365/238, 230, 189

[56] References Cited

U.S. PATENT DOCUMENTS 4,375,678 3/1983 Krebs .................................. 365/238

*Primary Examiner*—Terrell W. Fears
*Attorney, Agent, or Firm*—Anthony J. Sarli, Jr.; Jeffrey Van Myers

[57] ABSTRACT

In a dual page memory system sharable by first and second processors, a plurality of storage elements are assigned to first and second pages accessible by the respective processor. An address decoder decodes addresses provided by either of the processors, and provides a selection signal corresponding to a predetermined storage element in each of the pages. A page selector couples the selection signal to the storage element in the page assigned to that processor. An access controller provides access to that processor to the storage element to which the selection is coupled. An assignment controller is provided to selectively swap corresponding storage elements between the pages.

4 Claims, 3 Drawing Figures

DUAL PAGE MEMORY SYSTEM HAVING STORAGE ELEMENTS WHICH ARE SELECTIVELY SWAPPED BETWEEN THE PAGES

FIELD OF THE INVENTION

The present invention relates generally to a memory system having storage elements arranged into two separate pages and, more particularly, to a dual page memory system wherein the pages are selectively swapped between two processors.

BACKGROUND OF THE INVENTION

Various memory configurations have been proposed to accomodate very high speed exchange of blocks of information between two processors. In such situations, traditional serial or parallel communication techniques are either too slow or too hardware intensive. On the other hand, dual port RAMs have been used successfully in those applications where the information is only occasionally changed and the speed of the two processors is not too disparate. The latter limitation is not a problem in RAM-to-RAM block transfer type systems, since each processor has separate access to its own RAM. However, in addition to doubling the size of the RAM, either considerable time or circuitry is required to actually accomplish the transfer. Using page swapping, the two processors can share a multiplexed address decode and data access network to achieve a very fast and efficient block transfer. However, after every update and swap operation, the updating processor must make the same update again in order to assure that the correct information will be available in both pages. The effective throughput of the updating processor can thus be significantly degraded.

SUMMARY OF THE INVENTION

Accordingly, it is an object of the present invention to provide a memory system having a plurality of storage elements which are selectively assigned to either of two pages.

Another object of the present invention is to provide a dual page memory system wherein the storage elements comprising each page may be selectively swapped between the pages.

Yet another object of the present invention is to provide a dual page memory system in which corresponding storage elements in each of the two pages are swapped only if the contents of one of the storage elements has been updated since the last page swap.

In carrying out these and other objects of the present invention, there is provided, in one form, a memory system which has a plurality of storage elements each of which provides access thereto in response to the coupling of a selection signal thereto. In general, each of the storage elements is assigned to one of two pages, access to which is limited to a respective one of two processors. In response to an address signal provided by a selected one of the processors, a selection signal is provided corresponding to a predetermined storage element in each of the pages. This selection signal is then coupled to the corresponding storage element in the particular page assigned to the selected processor. The processor is then allowed access to the particular storage element in that page which corresponds to the selection signal. However, corresponding storage elements in each of the pages may be selectively swapped between the pages. In the preferred form, the only storage elements which will be swapped are those which have been updated since the last swap.

DETAILED DESCRIPTION OF THE INVENTION

Figure 1:
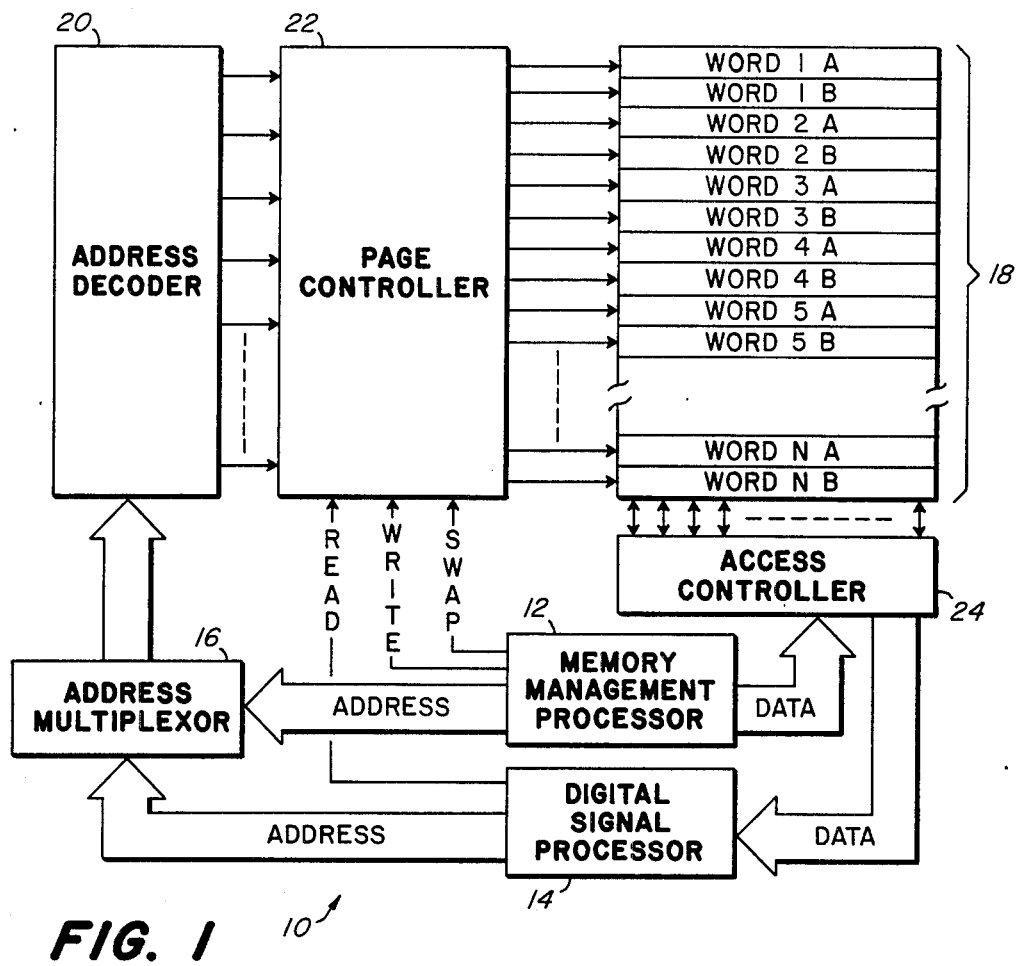
FIG. 1 illustrates a dual page memory system which is sharable by two processors.

Shown in FIG. 1 is a dual page memory system 10 which is sharable by two processors 12 and 14. In general, each of the processors 12 or 14 will provide an address signal whenever access to the memory system 10 is required. An address multiplexor 16 of conventional form selects which of the processors 12 or 14 may have access to the memory system 10 should both require access at the same time. In a application such as in a digital signal processing system, one of the processors, for example processor 12, is responsible for updating the information in the memory system 10 while the other processor, i.e. processor 14, is responsible for acting upon the information contained in the memory system 10. Thus, in such a system, processor 12 only needs to write information into the memory system 10 while processor 14 only needs to read information from the memory system 10. Since the activity of processor 12 is typically less critical than that of processor 14, the address multiplexor 16 will defer to processor 14 should simultaneous access be requested by both processors 12 and 14. On the other hand, since processor 12 is solely responsible for updating the contents of the memory system 10, page swapping may be requested only by processor 12.

In the illustrated form, the memory system 10 consists primarily of storage array 18, an address decoder 20, a page controller 22 and an access controller 24. The storage array 18 is comprised of a column of pairs A and B of storage locations 1 through N. Each storage location consists of a row of bits of read/write storage of conventional form, so that upon the coupling of a selection signal thereto, access is provided to a word of information. The page controller 22 initially assigns one of each pair of storage locations in the storage array 18 to a first page and the other of each pair to a second page, so that either of the pair may be accessed using the same address. The address decoder 16, which is of conventional form, provides, in response to an address signal provided by the particular processor 12 or 14 selected by the address multiplexor 16, a selection signal corresponding to a particular storage location 1 through N in each of the first and second pages. The page controller 22 then couples the selection signal to the corresponding storage location in the particular page which is assigned to the processor 12 or 14 selected by the address multiplexor 16. The access controller 24 comprises a data input buffer and a sense amplifier, each of conventional form, for each of the bits in the column of words in the memory system 10. In general, the access controller 24 provides the selected processor 12 or 14 access to the storage location in the selected page which corresponds to the selection signal.

As each storage location in the storage array 18 is updated in response to the assertion of a WRITE signal by the processor 12, the page controller 22 will store a signal indicating that that particular storage location is primed for swapping. After one or more of the storage locations in the storage array 18 have updated, the processor 12 may assert a SWAP signal to request that the updated information be swapped from the page assigned to the processor 12 into the page assigned to the processor 14. In response to the SWAP signal, the page controller 22 selectively swaps the pair of storage locations assigned to the two pages. In this manner, only those storage locations which have been updated are swapped. Since the swap operation is very rapid, the performance of the processor 14 is minimally affected. Since only the information updated since the last swap is swapped, the processor 12 can immediately resume update service to the page assigned to it without concern for earlier updates.

Figure 2:
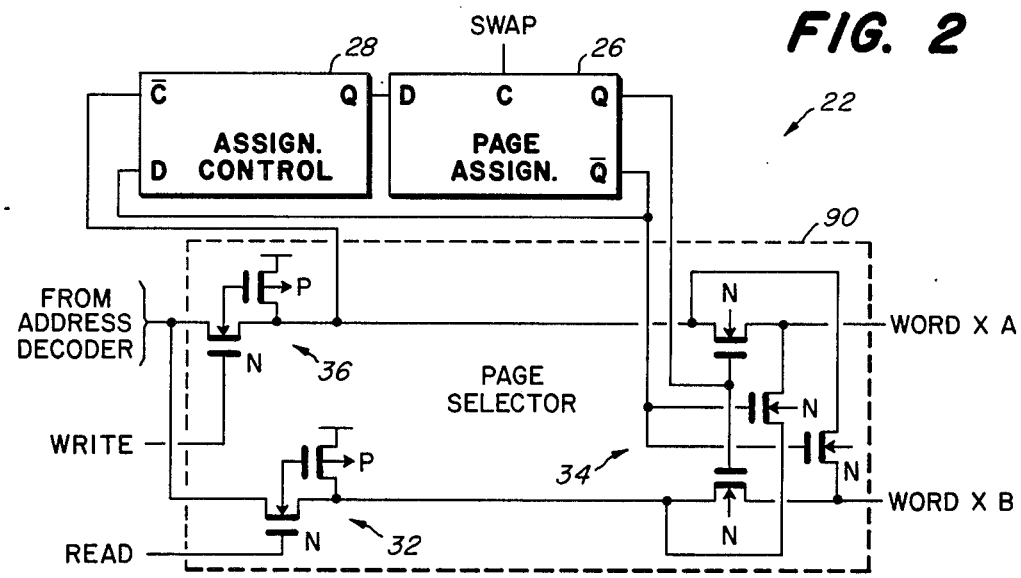
FIG. 2 illustrates a portion of the page controller in the dual page memory system of FIG. 1.

As shown in FIG. 2, the page controller 22 is comprised of a page assignment latch 26, an assignment control latch 28 and a page selector 30 for each of the pairs of storage locations in the storage array 18. In response to the assertion of a READ signal by processor 14, an appropriate page selector 30 will accept, via a coupler 32, the selection signal provided by the address decoder 20. Depending upon the state of the page assignment latch 26, as reflected by the Q and <Q> outputs thereof (where the symbology <Q> means the "logical complement of Q"), the page selector 30 will then couple, via a DPDT switch 34, the accepted selection signal to the particular one of the corresponding pair A or B of storage locations currently assigned to processor 14. Similarly, in response to assertion of the WRITE signal by the processor 12, page selector 30 will accept, via a coupler 36, the selection signal provided by the address decoder 20, and then couple the accepted selection signal to the other one of the pair B or A of storage locations currently assigned to the processor 12.

Also in response to assertion of the WRITE signal by processor 12, the assignment control latch 28 will latch the current state of the <Q> output of the page assignment latch 26. Thus, each time that the corresponding storage location in the page assigned to the processor 12 is updated, the Q output of the assignment control latch 28 will reflect the logical complement of the current state of the page assignment latch 26.

In response to assertion of the SWAP signal by the processor 12, the page assignment latch 26 will latch the current state of the assignment control latch 28. If the respective storage location has been updated since the last swap, the current state of the assignment control latch 28 will be the complement of the current state of the page assignment latch 26. Accordingly, after the swap, the state of the page assignment latch 26 will be the complement of the state before the swap. If, on the other hand, the respective storage location has *not* been updated since the last swap, the current state of the assigment control latch 28 will still reflect the state of the page assignment latch 28 *before* the last swap, which of course is the *current* state of the page assigment latch. Thus, after the swap, the state of the page assignment latch 26 will be the same as before the swap. In this manner, the page controller 22 will only effect a swap if the one of the pair A or B of storage locations assigned to the processor 12 has been updated since the last swap; otherwise, no swap will be effected.

Upon initial power-up, the several latches in the page controller 22 will assume arbitrary initial states, so that the initial page assignments are also arbitrary. Regardless, the processor 12 can simply proceed to initialize the contents of each of the storage locations in the storage array 18 which comprise the page initially assigned thereto. Following the first swap operation, the processor 14 can begin operation, and the processor 12 can begin updating as required. Since non-updated storage locations are never swapped into the page assigned to the processor 14, the initial page assignments are irrelevant for proper system operation.

Figure 3:
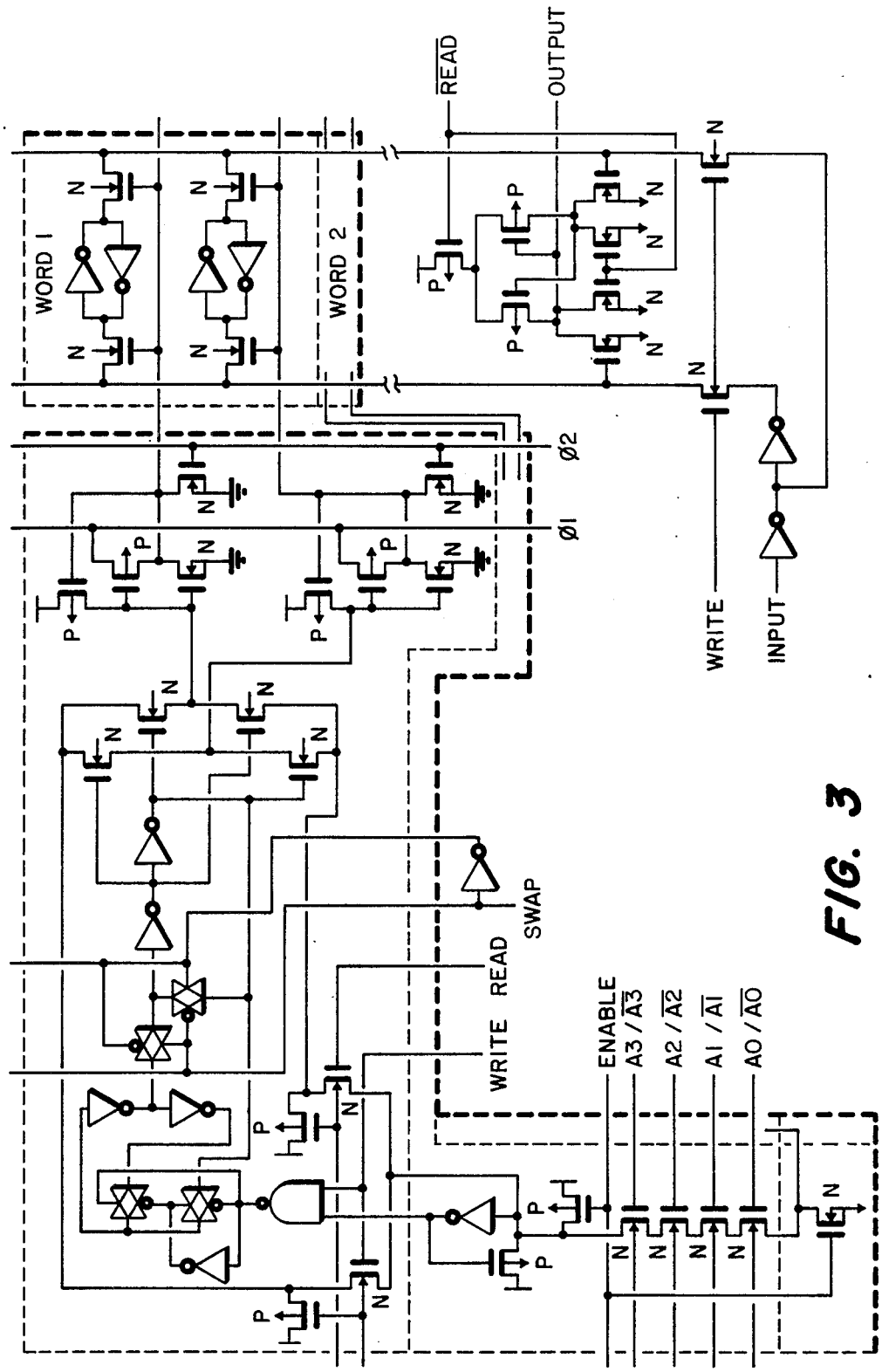
FIG. 3 is a schematic diagram of an embodiment of the dual page memory system of FIG. 2.

Shown in FIG. 3 is a schematic diagram illustrating an implementation in CMOS of the storage array 18, the address decoder 20, the page controller 22 and the access controller 24. In the illustrated form, the page assignment latch 26 and the assignment control latch 28 comprise half latches of conventional form. The remaining elements are also substantially conventional in form.

Although the memory system 10 has been described in the context of a particular application system, various changes may be made to facilitate use thereof in other applications. For example, additional logic may be provided to control the initial page assignments. Other logic may be added if desired to allow either processor 12 or 14 to update the storage array 18 and to effect a swap. If immediate access to the memory system is particularly critical for one of the processors 12 or 14, buffering logic may also be provided between the less critical processor and the address multiplexor to hold the address information until the memory system 10 is not being used by the critical processor. In this manner, the less critical processor can be released to perform other processing. This option would be particularly useful if the operating speed of the less critical processor is significantly slower that that of the critical processor, since the buffered access will often be completed before the slower processor either needs the information (in the event of a READ) or initiates the next access (in the event of a WRITE).

WHAT IS CLAIMED:

1. A memory system having first and second pages, each of which is accessible by a corresponding one of first and second processors, the system comprising:
   a plurality of storage locations, each of which provides access thereto in response to the coupling of a selection signal thereto;
   page assignment means for assigning a first set of the storage locations to the first page and a second set of the storage locations to the second page;
   address decoding means for providing, in response to an address signal provided by a selected one of said first and second processors, a selection signal corresponding to a predetermined storage location in each of said first and second pages;
   page selection means for coupling said selection signal to the corresponding storage location in the one of said first and second pages which is assigned to said selected one of said first and second processors;
   access control means for providing said selected processor access to the storage location in said selected page corresponding to said selection signal; and
   assignment control means for selectively swapping corresponding storage locations assigned to each of the first and second pages.

2. The memory system of claim 1 wherein the assignment control means selectively swap corresponding storage locations assigned to each of the first and second pages only if one of said storage locations has been updated since the immediately preceeding swap.

3. In a memory system having first and second pages, each of which is accessible by a corresponding one of first and second processors, the system comprising:
- a plurality of storage locations, each of which provides access thereto in response to the coupling of a selection signal thereto, a first set of the storage locations being assigned to the first page and a second set of the storage locations being assigned to the second page;
- address decoding means for providing, in response to an address signal provided by a selected one of said first and second processors, a selection signal corresponding to a predetermined storage location in each of said first and second pages;
- page selection means for coupling said selection signal to the corresponding storage location in the one of said first and second pages which is assigned to said selected one of said first and second processors; and
- access control means for providing said selected processor access to the storage location in said selected page corresponding to said selection signal;
- a method for controlling the assignment of the storage locations to the first and second pages, comprising the step of:
- selectively swapping corresponding storage locations assigned to each of the first and second pages.

4. The method of claim 3 wherein the step of selectively swapping is further characterized as selectively swapping corresponding storage locations assigned to each of the first and second pages only if one of said storage locations has been updated since the immediately preceeding swap.

* * * * *